(12) United States Patent
Prasad et al.

(10) Patent No.: US 8,091,006 B2
(45) Date of Patent: *Jan. 3, 2012

(54) SPHERICAL LATTICE CODES FOR LATTICE AND LATTICE-REDUCTION-AIDED DECODERS

(75) Inventors: Narayan Prasad, Plainsboro, NJ (US);
Xiaodong Wang, New York, NY (US);
Mohammad Madihian, Plainsboro, NJ (US)

(73) Assignee: NEC Laboratories America, Inc., Princeton, NJ (US)

( * ) Notice: Subject to any disclaimer, the term of this patent is extended or adjusted under 35 U.S.C. 154(b) by 1313 days.

This patent is subject to a terminal disclaimer.

(21) Appl. No.: 11/694,241

(22) Filed: Mar. 30, 2007

(65) Prior Publication Data

US 2007/0283210 A1 Dec. 6, 2007

Related U.S. Application Data

(60) Provisional application No. 60/803,734, filed on Jun. 2, 2006.

(51) Int. Cl.
*H03M 13/00* (2006.01)
(52) U.S. Cl. ........................ 714/752; 375/267
(58) Field of Classification Search .................. 714/752; 375/267
See application file for complete search history.

(56) References Cited

U.S. PATENT DOCUMENTS

| | | | | |
|---|---|---|---|---|
| 4,959,842 A * | 9/1990 | Forney, Jr. | ..... | 375/261 |
| 5,748,839 A * | 5/1998 | Serizawa | ..... | 704/222 |
| 6,084,534 A * | 7/2000 | Postol | ..... | 341/50 |
| 6,085,340 A * | 7/2000 | Postol | ..... | 714/701 |
| 6,404,820 B1 * | 6/2002 | Postol | ..... | 375/259 |
| 6,516,297 B1 * | 2/2003 | Servetto et al. | ..... | 704/222 |
| 6,614,861 B1 * | 9/2003 | Terry et al. | ..... | 375/347 |
| 6,654,928 B1 * | 11/2003 | Terry et al. | ..... | 714/792 |
| 7,583,763 B2 * | 9/2009 | Nissani (Nissensohn) | ..... | 375/341 |
| 7,660,363 B2 * | 2/2010 | Berenguer et al. | ..... | 375/267 |
| 7,720,169 B2 * | 5/2010 | Reuven et al. | ..... | 375/267 |
| 2004/0181419 A1 * | 9/2004 | Davis et al. | ..... | 705/1 |
| 2005/0113121 A1 * | 5/2005 | Terry et al. | ..... | 455/501 |
| 2005/0128936 A1 * | 6/2005 | Shao | ..... | 370/208 |
| 2005/0210039 A1 * | 9/2005 | Garrett | ..... | 707/100 |
| 2007/0162236 A1 * | 7/2007 | Lamblin et al. | ..... | 702/20 |
| 2007/0162827 A1 * | 7/2007 | Walton et al. | ..... | 714/774 |
| 2008/0015852 A1 * | 1/2008 | Kruger et al. | ..... | 704/225 |
| 2008/0097755 A1 * | 4/2008 | Xie | ..... | 704/222 |
| 2008/0108310 A1 * | 5/2008 | Tong et al. | ..... | 455/69 |
| 2008/0225976 A1 * | 9/2008 | Prasad et al. | ..... | 375/267 |
| 2009/0304114 A1 * | 12/2009 | Burg | ..... | 375/340 |

OTHER PUBLICATIONS

Agrell E. et al., "Optimization of Lattices for Quantization", IEEE Transactions on Information Theory, vol. 44, No. 5, pp. 1814-1828, Sep. 1998.

(Continued)

*Primary Examiner* — Stephen Baker
(74) *Attorney, Agent, or Firm* — Bao Tran; Joseph Kolodka

(57) ABSTRACT

Methods and apparatus for designing spherical lattice codebooks for use in data transmission systems are provided. A spherical lattice codebook is constructed by determining the channel statistics of one or more channels, which can be accomplished by observing a sufficiently large set of channel realizations. After determining the channel statistics, an expression for the error probability of the decoder or expressions for bounds on the error probability and expressions for the corresponding gradients are determined. The gradient is then used in an optimization technique to produce a spherical lattice codebook which is subsequently used for transmission.

31 Claims, 4 Drawing Sheets

OTHER PUBLICATIONS

El Gamal H. et al., "Lattice Coding and Decoding Achieve the Optimal Diversity—Multiplexing Tradeoff of MIMO Channels", IEEE Transactions on Information Theory, vol. 50, No. 6, pp. 968-985, Jun. 2004.

Hassibi, B. et al., "High-Rate Codes that are Linear in Space and Time", IEEE Transactions on Information Theory, vol. 48, No. 7, pp. 1804-1824, Jul. 2002.

Wang, X. et al., "Stochastic Gradient Algorithms for Design of Minimum Error-Rate Linear Dispersion Codes in MIMO Wireless Systems", IEEE Transactions on Signal Processing, vol. 54, No. 4, pp. 1242-1255, Apr. 2006.

L.G. Electronics, "Open Loop MIMO Scheme for EUTRA", in 3GPP R1-051338, Seoul Korea, Nov. 2005.

* cited by examiner

SPHERICAL LATTICE CODES FOR LATTICE AND LATTICE-REDUCTION-AIDED DECODERS

This application claims the benefit of U.S. Provisional Patent Application Ser. No. 60/803,734, filed Jun. 2, 2006, which is incorporated herein by reference in its entirety for all purposes.

FIELD OF THE INVENTION

The present invention relates generally to data transmission, and more particularly to the design of lattice space time codes for lattice decoders and lattice-reduction-aided decoders.

BACKGROUND OF THE INVENTION

Space-time block code (STBC) design for wireless fading channels has been an area of recent research. As a result, several STBCs (e.g., orthogonal designs and linear dispersion (LD) codes) have been developed. Algebraic number theoretic tools for code design have also been employed for the independent and identically distributed (i.i.d.) Rayleigh fading model with success. Additionally, the real-baseband model has been used to show that all STBCs are lattice codes. This reveals that the traditional STBC design.

where input information symbols are drawn from quadrature amplitude modulation (QAM) constellations or pulse amplitude modulation (PAM) constellations result in lattice codes with sub-optimum (in terms of energy efficiency) shaping regions. Thus, a need exists to further improve performance by designing lattice codes with optimized shaping regions.

Though it may be beneficial to fix input information symbols to be QAM symbols as this results in efficient maximum-likelihood (ML) decoding via the sphere decoder, the complexity of ML decoding can significantly increase for lattice codes with optimized shaping due to the problem of boundary control. One conventional way to balance this tradeoff is to employ sub-optimum decoders, which avoid boundary control and the increase in complexity, to decode optimized lattice codes.

Thus, there is a need to design optimal (in terms of error-rate) lattice codes for multiple-input multiple-output (MIMO) systems where the receiver employs lattice or lattice-reduction aided decoders. No such systematic design procedure has been previously proposed.

SUMMARY OF THE INVENTION

The present invention provides improved methods and apparatus for designing spherical lattice codebooks for use in data transmission systems. In an embodiment of the invention, a method of constructing a spherical lattice codebook is provided. The method includes determining the channel statistics of one or more channels, which can be accomplished by observing a sufficiently large set of channel realizations. After determining the channel statistics, an expression for the error probability of the decoder or expressions for bounds on the error probability and expressions for the corresponding gradients are determined. The gradient is then used in an optimization technique to produce a spherical lattice codebook which is subsequently used for transmission.

In another embodiment, a method of determining a spherical codebook satisfying a peak energy constraint is provided. First, a plurality of translation vectors and a set of lattice points for each one of the vectors are found. Then, a spherical code satisfying the peak energy constraint is selected where the spherical code corresponds to a set of lattice points and the translation vector.

In still another embodiment, an iterative method of selecting a spherical lattice codebook to reduce an average transmit energy constraint is provided. A centroid of the potential codebook is defined. The translation vector is replaced with the negative of the centroid and a set of lattice points closest to the centroid are found. The method is repeated iteratively, replacing the translation vector with the negative of the centroid until the translation vector converges.

These and other advantages of the invention will be apparent to those of ordinary skill in the art by reference to the following detailed description and the accompanying drawings.

DETAILED DESCRIPTION

The present invention generally provides methods and apparatus for designing optimal lattice codes. More specifically, lattice codes with minimum error rates when lattice decoders and lattice-reduction-aided (LRA) decoders are employed at the receiver are designed. This is achieved by employing stochastic optimization techniques. The new design methodology may be tailored to obtain optimal lattice (e.g., space-time) codes for any fading statistics and/or any signal-to-noise ratio (SNR) of interest.

One of the main problems in designing optimal lattice codes is that obtaining closed-form objective functions needed for deterministic optimization or other analytical techniques seems intractable, even for the simple i.i.d Rayleigh fading model. To compensate for this problem, in one embodiment, stochastic optimization based on the gradient estimation is used. These techniques may be used to obtain optimal lattice codes for arbitrary fading statistics and/or SNRs of interest. One of ordinary skill in the art will recognize that other stochastic optimization techniques may be employed.

Further, various embodiments include methods of obtaining low error-rate spherical lattice codes for various decoders. In one embodiment, the set of lattice generator matrices is restricted to the group of orthogonal matrices. In other embodiments, the spherical lattice codes are constructed (e.g., computed, generated, calculated, etc.) so as to satisfy certain constraints (e.g., a peak energy constraint, an average power constraint, etc.).

Figure 1:
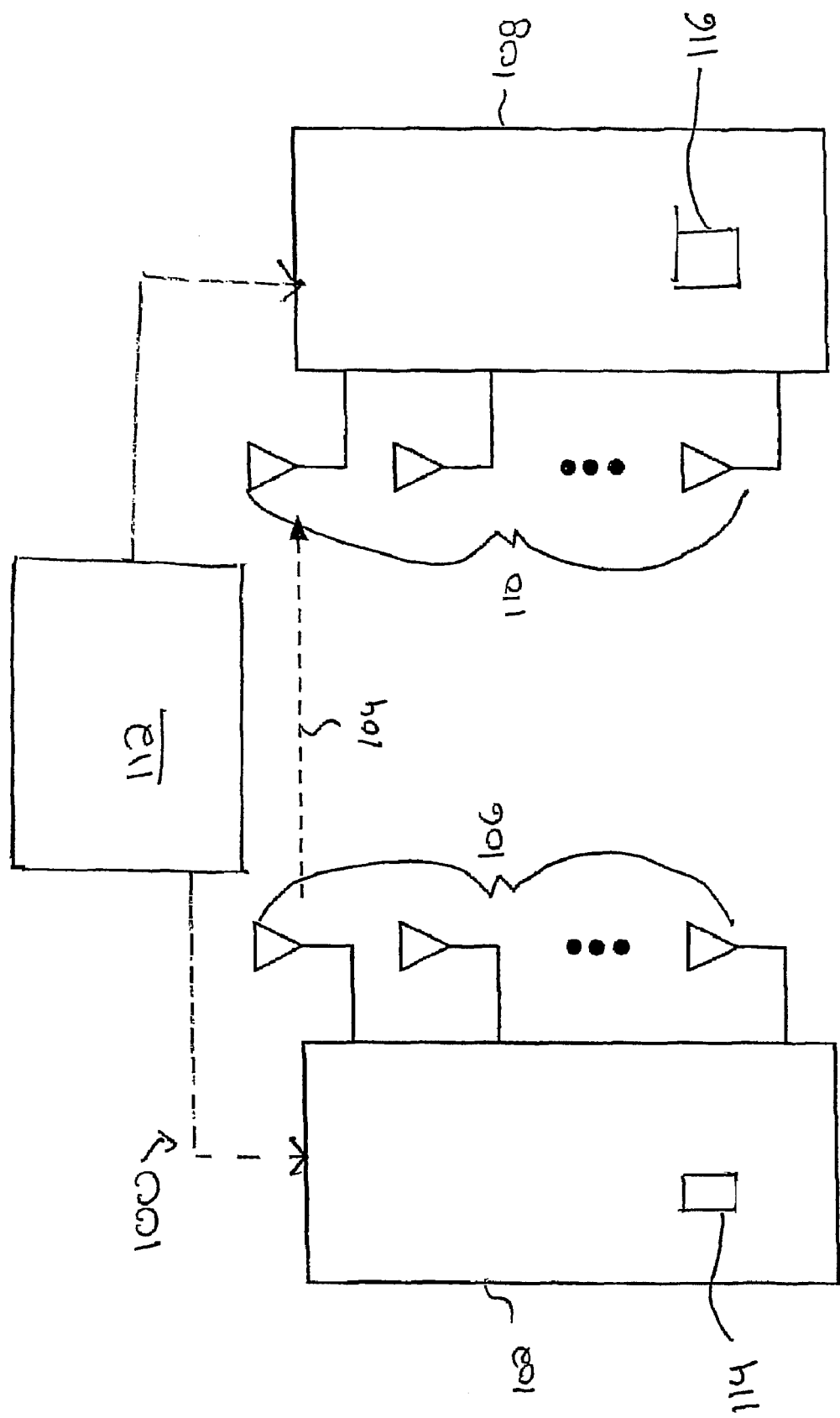
FIG. 1 shows a system for data transmission in accordance with an embodiment of the invention.

FIG. 1 depicts a system 100 for data transmission in accordance with an embodiment of the invention. The system 100 comprises a transmitter 102. The transmitter 102 may be adapted to transmit signals (e.g., wireless communication signals) 104 via transmission antennas 106 or any other suitable transmission method (e.g., via wireline transfer, etc.).

The system 100 may further comprise a receiver 108 having reception antennas 110, either of which may be adapted to receive signals 104 from the transmitter 102 and/or the transmission antennas 106). The system 100 may also have a controller 112 which may be in communication with the transmitter 102, the antennas 106 and/or 110, the receiver 108, and/or any other device in the system 100.

System 100 may further comprise an encoder 114 (e.g., a code and/or codebook generator) and/or a decoder 116. Encoder 114 may be component of and/or separate from the transmitter 102 and/or the controller 112. Similarly, decoder 116 may be component of and or separate from the receiver 108 and/or the controller 112. Encoder 114 and decoder 116 may be adapted to encode and decode, respectively, one or more signals transmitted in the system 100. For example, the decoder 116 may decode a signal to determine characteristics of a transmitted signal and/or channel over which the signal was transmitted (e.g., determine channel statistics).

Transmitters 102, receivers 108, and other system components of the system 100 are well known in the art. It is understood that any appropriate combination of these components may be used to implement the invention as described herein. For example, the method steps of methods 200, 300, and 400 may be employed on, by, or at any combination of the controller 112, transmitter 102, the antennas 104 and/or 110, the receiver 108, encoder 114, decoder 116, and/or any other device in the system 100. It is further understood that some part of the method steps and/or determinations and/or calculations described herein may be performed by unconnected devices and/or methods. That is, some method steps may be performed by a device similar to or the same as a controller 112 offline. Similarly, some method steps may be performed by a controller 112 on-line while other method steps are performed offline.

Transmitter 102 may be capable of transmitting multiple streams over multiple parallel channels (e.g., signals 104 and/or over antennas 106 and/or 110). Similarly, receiver 108 may be capable of receiving signals 104.

Though depicted in FIG. 1 as separate components of system 100 for ease of description, one of skill in the art will recognize that transmitter 102 and receiver 108 may be a single component. That is, a single component may have both a transmitter 102 and a receiver 108.

Controller 112 may be adapted to communicate information (e.g., calculations, tables, equations, instructions, sequences of instructions, and/or the results of calculations of methods 200, 300, and 400) to the components of system 100 such that components 102-110, 114, and 116 may then be capable of utilizing the communicated information as discussed below with respect to the controller 112 and the methods 200, 300, and 400. In some embodiments, controller 112 may communicate information during a set-up operation. That is, information generated offline may be pre-loaded onto one or more of components 102-110, 114, and 116.

In some embodiments, the controller 112 may be or may include any components or devices which are typically used by, or used in connection with, a computer or computer system. Although not explicitly pictured in FIG. 1, the controller 112 may include one or more central processing units, read only memory (ROM) devices and/or a random access memory (RAM) devices.

According to some embodiments of the present invention, instructions of a program (e.g., controller software) may be read into a memory of the controller 112 from another medium, such as from a ROM device to a RAM device or from a LAN adapter to a RAM device. Execution of sequences of the instructions in the program may cause the controller 112 to perform one or more of the process steps described herein. In alternative embodiments, hard-wired circuitry or integrated circuits may be used in place of, or in combination with, software instructions for implementation of the processes of the present invention. Thus, embodiments of the present invention are not limited to any specific combination of hardware, firmware, and/or software. The memory may store the software for the controller which may be adapted to execute the software program, and thereby operate in accordance with the present invention, and particularly in accordance with the methods described in detail below. However, it would be understood by one of ordinary skill in the art that the invention as described herein can be implemented in many different ways using a wide range of programming techniques as well as general purpose hardware sub-systems or dedicated controllers.

The program may be stored in a compressed, uncompiled and/or encrypted format. The program furthermore may include program elements that may be generally useful, such as an operating system, a database management system and device drivers for allowing the controller to interface with computer peripheral devices and other equipment/components. Appropriate general purpose program elements are known to those skilled in the art, and need not be described in detail herein.

As indicated herein, the controller 112 may generate, receive, store and/or use for computation databases including data related to transmission, codebook determination, encoding and/or decoding. As will be understood by those skilled in the art, the schematic illustrations and accompanying descriptions of the structures and relationships presented herein are merely exemplary arrangements. Any number of other arrangements may be employed besides those suggested by the illustrations provided. For example, in a particular advantageous embodiment, the design of lattice code is performed offline after determining the channel statistics. Once the lattice code is matched to the current channel, it is used online for transmission as is discussed in detail below.

The present invention includes methods for designing spherical lattice codes for use in multiple-input multiple-output (MIMO) systems, such as system 100. Such a system 100 may be an M-transmit N-receive MIMO channel with no channel state information (CSI) at the transmitter 102 and perfect CSI at the receiver 108. The channel (e.g., wireless channel) is assumed to be quasi-static and flat fading and can be represented by an N×M matrix $H^c$ which is assumed to remain fixed for t=1, ..., T. The complex-baseband model of the received signal can be expressed as $$y_t^c = \sqrt{\frac{\rho}{M}} H^c x_t^c + w_t^c,$$

where ρ is the average transmit power, $$\sqrt{\frac{\rho}{M}} x_t^c \in C^M$$

is the transmitted signal at time t, t=1, ..., T, $y_t^c \in C^N$ is the received signal, $w_t^c \in C^N$ is the i.i.d. circularly symmetric Gaussian noise, and $w_t^c \sim N_c(0,I)$. The random variables in $H^c$ are assumed to be drawn from some continuous joint distribution.

The equivalent real-valued channel model corresponding to $$y_t^c = \sqrt{\frac{\rho}{M}} H^c x_t^c + w_t^c$$

may be written as y=Hx+w where $x=[x_1^T, \ldots, x_T^T]^T \in \beta^{2MT}$ is a codeword belonging to a codebook C where $$x_t = \begin{bmatrix} \Re\{x_t^c\} \\ \Im\{x_t^c\} \end{bmatrix}, H = I_T \otimes H = I_T \otimes \sqrt{\frac{\rho}{M}} \begin{bmatrix} \Re\{H^c\} & -\Im\{H^c\} \\ \Im\{H^c\} & \Re\{H^c\} \end{bmatrix}.$$

In one embodiment of the invention, a designed codebook $C \subseteq \beta^{2MT}$ satisfies the average energy (e.g., power) constraint $$\frac{1}{|C|} \sum_{x \in C} \|x\|^2 \leq TM.$$

In another embodiment, the codebook satisfies the peak energy (e.g., power) constraint $\|x\|^2 \leq TM$, $\forall x \in C$. In these embodiments, the codebooks are also designed to exhibit low error-rate performance. The rate of the code is $$R = \frac{1}{T} \log_2 |C|$$

bits/s/Hz and ρ denotes the average transmit power.

An n-dimensional lattice Λ is defined by a set of n basis (column) vectors $g_1, \ldots, g_n$ in $\beta^n$. The lattice is composed of all integral combinations of the basis vectors. That is, $\Lambda = \{x = Gz: z \in Z^n\}$, where $Z = \{0, \pm 1, \pm 2, \ldots\}$ and G is an n×n non-singular generator matrix given by $G = [g_1, g_2, \ldots, g_n]$. In the Euclidean space, the closest lattice point quantizer Q(.) associated with Λ is defined by Q(r)=x∈Λ, if $\|r-x\| \leq \|r-x'\|$, $\forall x' \in \Lambda$, where ties are broken arbitrarily.

The Voronoi cell $V_0(G)$ of Λ is the set of points in $\beta^n$ closest to the origin. The Voronoi cell associated with each $x=Gz \in \Lambda$ is a shift of $V_0(G)$ by x and is denoted $V_z(G)$. The n-dimensional volume of the Voronoi cell is given by $Vol(V_0(G)) = \sqrt{\det(G^T G)}$.

The dimension of the lattice generated by G is n=2MT. A finite set of points in the n-dimensional translated lattice $(\Lambda+u, u \in \beta^n)$ can be used as codewords of a codebook C. For a rate R, the codebook will contain $|C|=2^{T \cdot R}$ such points. A lattice code using the three-tuple $\{G, \{z_i\}_{i=1}^{|C|}ee, u\}$ is specified. Here, u is the translation vector and $\{Z_i\}$ are the coordinate vectors. For a given G and u, the code will be referred to as the spherical lattice code if the coordinate vectors are a solution to $$\min_{\{z_i \in Z^n\}} \sum_{i=1}^{|C|} \|Gz_i + u\|^2.$$

In lattice decoding, the receiver 108 assumes that any point in the infinite lattice could have been transmitted. For a given lattice, the naive lattice decoder determines $$\hat{z} = \underset{z \in Z^n}{\mathrm{argmin}} \|y - Hu - HGz\|.$$

This decoder is distinguished from the nearest-codeword decoder (e.g., the ML decoder). The absence of boundary-control results in substantial savings in complexity. One property of lattice codes with naive lattice decoders is that, owing to the lattice symmetry (geometric uniformity), the error probability is invariant to conditioning on a particular transmitted lattice codeword and only depends on the lattice generator. Thus, selecting the codewords of minimum norm minimizes the average transmit power. Hence spherical lattice codes are advantageous for the naive lattice decoder.

A minimum mean square error-generalized decision feedback equalizer (MMSE-GDFE) front-end can dramatically improve the performance of the lattice decoding algorithms in MIMO systems. This decoder determines an upper triangular matrix B from the Cholesky decomposition of the matrix $I_n + H^T H$ and a matrix $F=(HB^{-1})^T$ and returns $$\hat{z} = \underset{z \in Z^n}{\mathrm{argmin}} \|Fy - Bu - BGz\|.$$

For an equivalent system model for the MMSE lattice decoder:

$$\tilde{y} = Fy - Bu = BGz + \underbrace{(FH - B)(Gz + u) + Fw}_{v}.$$

Assuming x=Gz+u to be zero-mean with $E\{xx^T\}=(½)I$ and since w~N(0,(½)I) is independent of x, $E\{vv^T\}=(½)I$. Although v contains a signal (z) dependent term, assuming v~N(0,(½)I) is effective. Herein, these assumptions are used. Accordingly, the error probability yielded by MMSE lattice decoder is identical to that of a naive lattice decoder operating on ỹ=BGz+v with v as an independent AWGN so that spherical lattice codes are optimal for the MMSE lattice decoder as well.

A lattice-reduction-aided (LRA) receiver is a low-complexity detector which yields good performance. The LRA receiver makes a change of basis such that the decision regions of the detectors are improved and more robust to noise. If the generator matrix HG described above is a basis of the lattice, HGP is also a basis of the same lattice if P and P−1 have integer entries. Such a matrix P is known as a unimodular matrix and satisfies |P|=±1. The purpose of the LRA receiver is to find a change of basis P to optimize the decision regions of the detector. This is known as the lattice reduction problem. The purpose of lattice basis reduction is, given an arbitrary lattice basis, to obtain a basis of the shortest possible vectors (e.g., vectors as close as possible to being mutually orthogonal).

In one embodiment, the basis is reduced with a Lenstra-Lenstra-Lovász (LLL) reduction algorithm. Other types of reduced bases are the Korkin-Zolotarev (KZ) basis, the Minkowski basis, the Seysen basis, and hybrids, each of which have different reduction criteria. In general, the reduction of these basis are more time consuming. LRA linear receivers assume that the signal was transmitted in the reduced basis to equalize the new basis and return the decoded symbol to the original basis. This embodiment is more robust against noise enhancement. In this way, $\hat{z}=PI((HGP)^{-1}(y-Hu))$ where the quantizer I quantizes its input vector componentwise to the nearest integer.

Reducing $(HG)^{-T}$ may yield better performance. In particular, this decoder (e.g., a type 2 LRA decoder) works as follows. $C=(HG)^{-T}P$ is the reduced version of $(HG)^{-T}$, typically obtained through LLL reduction. The decision vector is obtained as $\hat{z}=P^{-T}I(C^T(y-Hu))$. The performance of both the LRA decoders can further be improved by MMSE pre-processing.

As before, $\tilde{y}=Fy-Bu$ and the resulting model is assumed to be given by $\tilde{y}=BGz+v$ where $v\sim N(0,(\frac{1}{2})I)$. The LRA decoders are then applied, where BG is the effective generator matrix. Spherical lattice codes for MMSE-LRA decoders can be designed using the assumed model.

Figure 2:
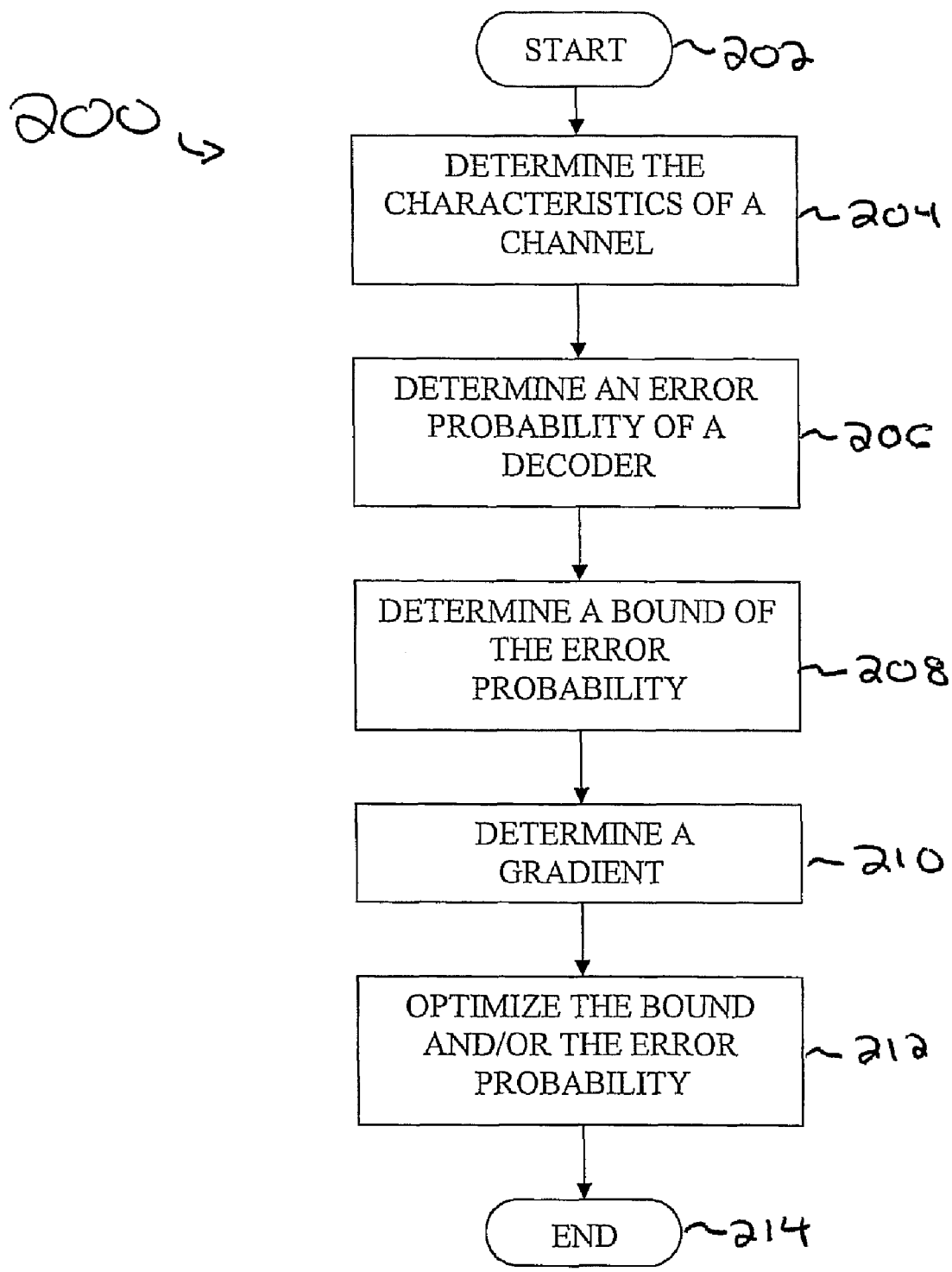
FIG. 2 is a flowchart showing the steps of a method of designing a spherical lattice code according to an embodiment of the present invention.

FIG. 2 illustrates a method 200 of designing a spherical lattice code according to an embodiment of the present invention. In a particular advantageous embodiment, the spherical lattice code is designed offline (e.g., by controller 112 and/or another device) and is subsequently used for transmission in the transmission system 100 (e.g., the code may be given to the transmitter 102, the receiver 108, the encoder 114, the decoder 116, and/or any other appropriate means). The method begins at step 202.

In step 204, characteristics of a channel are obtained. In at least one embodiment, the characteristics of a channel are the channel statistics and are obtained from a set of channel realizations. In such embodiments, the set of channel realizations may be a large set.

In step 206, an error probability of the decoder (e.g., an analytical expression and/or formula for the error probability) is determined. The decoder may be a lattice decoder or a LRA decoder as discussed above. In other embodiments, the decoder may be a ML decoder or any other appropriate decoder.

In one embodiment, the exact error probability is determined. For the naive lattice decoder it may be assumed that $z=0$ is the transmitted coordinate vector. $P_e(G)$ is the error probability (averaged over the channel realizations) of a spherical lattice code with a generator G. Accordingly, since $$\hat{z} = \underset{z \in Z^n}{\operatorname{argmin}} \|y - Hu - HGz\|,$$

$$P_e(G) = E_H\{Pr\{w \notin V_o(HG)|H\} = 1 - \pi^{-n/2}\int_{V_o(HG)} \exp(-\|w\|^2) dw.$$

The integral here is, in general, difficult to obtain in a closed form. However, in some embodiments its derivative can be estimated.

In another embodiment, the error probability of an LRA decoder may be determined. In an illustrative embodiment, a type 2 LRA decoder without MMSE pre-processing is considered. The unimodular matrix P is obtained via LLL reduction. $Gz_i+u$ is the transmitted codeword. From the decision rule $\hat{z}=P^{-T}I(C^T(y-Hu))$, an error event occurs if $P^T z_i \neq I(C^T(y-Hu))$. Since $C=(HG)^{-T}P$, an error event occurs if $P^T z_i \neq I(P^T z_i + C^T w)$, which is identical to the event $$\bigcup_{i=1}^{n} \{|\eta_i| \geq \frac{1}{2}\}$$

where $$\eta = [\eta_1, \ldots, \eta_n]^T = C^T w \sim N(0, \frac{1}{2}C^T C).$$

Thus, the error probability for a LRA decoder is $$P_e(G) = E_H\left\{Pr\left(\bigcup_{i=1}^{n}\{|\eta_i| \geq \frac{1}{2}\}|H\right)\right\} = 1 - E_H\left\{Pr\left(\bigcup_{i=1}^{n}\{|\eta_i| < \frac{1}{2}\}|H\right)\right\}.$$

As seen here, the error probability depends only on the generator matrix G and for a given generator $\alpha G$, it is monotonically decreasing $\alpha>0$. Thus spherical lattice codes are optimal for LRA decoders.

In another embodiment, error probability of a LRA-successive interference cancellation (LRA-SIC) decoder may be determined. In a type 2 LRA-SIC decoder without MMSE processing, $z_i$ is a transmitted coordinate vector. From the decision rule, as above, an error occurs if $P^T z_i \neq \hat{z}_i$. An important property of the LRA-SIC detector is that the joint error event of the detector is identical to that of the genie-aided (e.g., perfect feedback) counterpart. Accordingly, where D denotes the diagonal matrix formed by the diagonal elements of L, an error occurs if and only if $$D^{-1}Q^T w \notin \left(-\frac{1}{2}, \frac{1}{2}\right)^n.$$

Thus, the error probability is $$P_e(G) = 1 - E_H\left\{\pi^{-n/2}|D|\int_{[-\frac{1}{2},\frac{1}{2}]^n} \exp(-x^T D^2 x) dx\right\}.$$

In step 208 a bound on the error probability is determined. The bound may be an upper bound and/or a lower bound.

The upper bound (e.g., union upper bound) on the conditional error probability of the lattice decoder can be written as:

$$Pr(w \notin V_o(HG)|H) \leq P_e^{ub}(G, H) = \sum_{z \in \Re} Q(\sqrt{z^T G^T H^T HGz/2})$$

where $Q(.)$ is the standard Q function and $\Re$ is the set of all relevant coordinate vectors for a given HG such that $\{HGz\}_{z \in \Re}$ determines all facets of $V_0(HG)$. Algorithms to determine all such coordinate vectors are known in the art. For a n-dimensional lattice generator, the maximum number of relevant vectors is $(2^{n+1}-2)$. Thus, the unconditional upper bound may be obtained after averaging over H.

Similarly, a lower bound on the conditional error probability of the lattice decoder may be determined. In an exemplary embodiment to illustrate determining the lower bound, the kissing number of a lattice generated by $HG(\phi)$ is 2 (e.g., there are exactly two shortest (non-zero) vectors in the lattice). Letting $HG(\phi)z_1$ and $HG(\phi)z_2$ denote these vectors, $Z_2 = -z_1$ and $z_1$ and $Z_2$ are relevant. Since the half-spaces $\{y: \|y - HG(\phi)z_1\|^2 \leq \|y\|^2\}$ and $\{y: \|y + HG(\phi)z_1\|^2 \leq \|y\|^2\}$ do not overlap a conditional lower bound is given by: $\Pr(w \notin V_0(HG)|H) \geq P_e^{lb}(G,H) = Q(\sqrt{z_1^T G^T H^T H G z_1}/2) + Q(\sqrt{z_2^T G^T H^T H G z_2}/2)$. Further, the unconditional upper bound may be obtained after averaging over H.

In step 210, a gradient is determined. The gradient (e.g., function) may be a gradient of the error probability, a gradient of the upper bound, a gradient of the lower bound, or may be some other appropriate function which may be optimized in step 212.

To estimate the derivative of the error probability in step 206, for a fixed generator HG and a random vector q with n i.i.d components having uniform U[0,1] elements, the vector $HGq - Q(HGq)$ is uniformly distributed over $V_0(HG)$. As a result:

$$P_e(G) = 1 - \pi^{-n/2} E_H \left\{ |G^T H^T H G|^{1/2} E_q \left\{ \exp\left(-\min_{z \in Z^n} \|HGq - HGz\|^2\right)\right\}\right\}.$$

Designating $s_{max}(.)$ and $s_{min}(.)$ as the maximum and minimum singular values of the matrix argument and $G(\Phi)$ as a differentiable function of $\Phi$, for any element $\phi$ of $\Phi$:

$$\left\{\frac{\partial}{\partial \phi} E_q\left\{\exp\left(-\min_{z \in Z^n} \|HGq - HGz\|^2\right)\right\}\right\} =$$
$$\sum_{z \in Z} E_q \left\{ X(HGq \in V_z(HG)) \frac{\partial}{\partial \varphi} \exp(-\|HG(\varphi)q - HG(\varphi)z\|^2)\right\}$$

where $X(.)$ is the indicator function and Z is any finite set of coordinate vectors such that $\cup_{z \in Z} V_z(HG)$ covers the bounded fundamental parallelotope $\{HGq, q \in [0,1]^n\}$.

The derivative of $P_e(G)$ with respect to $\phi \in \Phi$ may then be computed by first exchanging it with expectation over H and applying $$\sum_{z \in Z} E_q\left\{X(HGq \in V_z(HG))\frac{\partial}{\partial \varphi}\exp(-\|HG(\varphi)q - HG(\varphi)z\|^2)\right\}.$$

For the present design algorithm, an estimate of the gradient of the upper bound is determined. To determine this gradient, let z be a relevant coordinate vector for the lattice generated by $HG(\phi)$. Then $\exists \Delta > 0$ small enough that $\forall \delta \in [-\Delta, \Delta]$, z remains a relevant coordinate vector for the lattice generated by $HG(\phi + \delta)$.

For a given $HG(\phi)$, the number of relevant coordinate vectors in $\Re$ may be equal to the upper bound. Accordingly, $\forall \delta \in [-\Delta, \Delta]$, the set $\Re$ contains all relevant vectors of $HG(\phi + \delta)$. A derivative of the upper bound (conditioned on H) where $\Re$ is a fixed set:

$$\frac{\partial P_e^{ub}(G, H)}{\partial \varphi} = \sum_{z \in \Re}\left(\frac{-\exp(-z^T G^T H^T H G z/4)}{\sqrt{\pi z^T G^T H^T H G z}} z^T G^T H^T H \frac{\partial G(\varphi)}{\partial (\varphi)} z\right).$$

In this case, the fading matrix is drawn from a continuous distribution and the generator G has no structure such that HG always has the maximum number of relevant vectors. Thus, the unconditional upper bound's derivative may be obtained after averaging over H.

Similarly, the derivative of the lower bound is $$\frac{\partial P_e^{lb}(G, H)}{\partial \varphi} = \sum_{i=1}^{2}\left(\frac{-\exp(-z_i^T G^T H^T H G z_i/4)}{\sqrt{\pi z_i^T G^T H^T H G z_i}} z_i^T G^T H^T H \frac{\partial G(\varphi)}{\partial (\varphi)} z_i\right).$$

Since the fading matrix is drawn from a continuous distribution and the generator G has no structure, HG always has the minimum kissing number. Thus, the unconditional lower bound's derivative may be obtained after averaging over H.

In another embodiment, the gradient of the error probability of a LRA decoder may be determined. The error probability may be expanded such that:

$$P_e(G) = 1 - E_H\left\{\pi^{-n/2}|C^T C|^{-1/2}\int_{[-\frac{1}{2},\frac{1}{2}]^n}\exp(-x^T(C^T C)^{-1}x)dx\right\}$$

$$=_{(a)} 1 - E_H\left\{\pi^{-n/2}|G^T H^T H G|^{1/2}\int_{[-\frac{1}{2},\frac{1}{2}]^n}\right.$$

$$\left.\exp(-x^T P^{-1} G^T H^T H G P^{-T} x)dx\right\},$$

where (a) follows after noting that $|P|^2 = 1$ since P is unimodular. The matrix P is obtained through the LLL reduction of $(HG)^{-T}$ and $C = (HG)^{-T} P = [c_1, \ldots, c_n]$ is LLL reduced for some parameter $\alpha \in (0,1)$ (e.g., $\alpha = 3/4$) if:

$$|\mu_{i,j}| = \left|\frac{\hat{c}_j^T c_i}{\hat{c}_j^T \hat{c}_j}\right| \leq \frac{1}{2}, i > j$$

$$\alpha \|\hat{c}_i\|^2 \leq \|\hat{c}_{i+1} + \mu_{i+1,i}\hat{c}_i\|^2,$$

$$1 \leq i \leq n - 1,$$

with $$\hat{c}_i = c_i - \sum_{j=1}^{i-1}\frac{\hat{c}_j^T \hat{c}_j}{\hat{c}_j^T \hat{c}_j}\hat{c}_j,$$

$$1 \leq i \leq n.$$

For a given G, there exists a set $A = \{H\}$ of measure one over which $C = (HG)^{-T} P$ satisfies all the conditions of $|\mu_{i,j}|$ above with strict inequality, where P is obtained with LLL reduction of $(HG)^{-T}$. For any $H \in A$ using standard continuity arguments, it shown that $\forall \delta \in [-\Delta, \Delta]$, were $\Delta > 0$ is small enough, the matrix P remains the unimodular matrix via the LLL reduction of $(HG(\phi+\delta))^{-T}$ and $C_{67} = (HG(\phi+\delta))^{-T} P$ satisfies the conditions of $|\mu_{i,j}|$ above. Thus, the derivative is:

$$\frac{\partial}{\partial \phi}\left(|G(\phi)^T H^T H G(\phi)\|^{1/2}\int_{[-\frac{1}{2},\frac{1}{2}]^n}\exp(-x^T P^{-1} G(\phi)^T H^T H G(\phi) P^{-T} x)dx\right\}$$

and P may be treated as invariant to $\phi$. Accordingly, the gradient $P_e(G)$ is given by:

$$\frac{\partial P_e(G)}{\partial \phi} = -E\left\{\pi^{-n/2}|G(\phi)^T H^T H G(\phi)|^{1/2}\right.$$

$$\int_{[-\frac{1}{2},\frac{1}{2}]^n} \left(tr\left(G(\phi)^{-T} \frac{\partial G(\phi)}{\partial \phi}\right) - 2x^T P^{-1} G(\phi)^T H^T H\left(\frac{\partial g(\phi)}{\partial \phi}\right) P^{-T} x\right)$$

$$\left.\exp(-x^T P^{-1} G(\phi)^T H^T H G(\phi) P^{-T} x) dx\right\}$$

Derivatives for other LRA decoders (e.g., decoders of other types) may be derived similarly.

For example, in another illustrative embodiment, the derivatives of LRA-SIC decoders may be determined.

To obtain $$\frac{\partial P_e(G, H)}{\partial \phi},$$

it is assumed that P remains invariant to small changes in $\phi$ so that:

$$\frac{\partial P_e(G, H)}{\partial \phi} = -\frac{\partial}{\partial \phi}\left(\pi^{-n/2}|D(\phi)| \int_{[-\frac{1}{2},\frac{1}{2}]^n} \exp(-x^T D(\phi)^2 x) dx\right).$$

$$\frac{\partial D(\phi)}{\partial \phi}$$

is then obtained by defining $\tilde{C} = C^{-T}$ and letting $\tilde{C}_{:,n}$ be its sub-matrix comprising columns having indices i to n so that $$D_{i,i}^{-2} = L_{i,i}^{-2} = \left[\left(\tilde{C}_{i:n}^T \tilde{C}_{i:n}\right)^{-1}\right]_{1,1}.$$

$$\frac{\partial P_e(G)}{\partial \phi}$$

is then estimated as $$E_H \frac{\partial P_e(G, H)}{\partial \phi}.$$

In step 212, the error probability and/or its bounds are optimized. In one embodiment, a stochastic gradient descent algorithm is used to optimize the probability of error over a feasible set of generator matrices. One of skill in the art will recognize other optimization methods of the error probability and/or its bounds may be used.

In general form, the optimization algorithm may be as described below. Let w denote a random vector defined over some sample space. Also, let $\theta$ denote the vector of parameters lying in a feasible set $\Theta$. The objective is to minimize $f(\Theta) = E\{g(\Theta, w)\}$ over $\Theta$ using "noisy" but unbiased estimates of $f'(\Theta) = \nabla_\theta f(\theta) = E\{\nabla_\theta g(\theta, w)\}$. The stochastic gradient descent algorithm is as follows—Let $\theta_k$ denote the vector of parameters at the $k^{th}$ step. Then, the $(k+1)^{th}$ iteration proceeds as:

Draw L samples $w_1, \ldots, w_L$.

Obtain unbiased gradient estimate (e.g., as in step 210 above):

$$f'(\theta_k) = \frac{1}{L}\sum_{l=1}^{L} \nabla_\theta g(\theta, w_l)|_{\theta=\theta_k}.$$

Update:

$$\theta_{k+1} = \prod_\Theta (\theta_k - a_k f'(\theta_k)).$$

The step-size sequence $\{a_k\}$ is generally chosen as the harmonic series $a_k = c/k$, where c is a positive scalar. $\Pi_\Theta(.)$ resembles a projection operator in that it finds a point in the feasible set close to the input argument when the latter falls outside the feasible set. For the method 200, any of the three objective functions defined above may be used since their gradients are available in the required form (e.g., as derived in step 210) such that their unbiased estimates can be obtained by averaging over a sufficiently large set of channel realizations.

To satisfy the average energy constraint as discussed above, the feasible set of generator matrices is:

$$\Theta_{avg} = \left\{G \div \min_{z_i \in Z^n], u \in \chi^n} \left\{2^{-RT} \sum_{i=1}^{2^{RT}} \|Gz_i + u\|^2\right\} \leq MT\right\}.$$

The error probabilities obtained in step 206 for a given generator G are invariant to the choice of coordinate vectors $\{z_i\}$ as well as the translation vectors. As a result, the error probability may be minimized over the set $\Theta_{avg}$. For a given G, one embodiment of the present invention provides a technique for obtaining a spherical lattice code (e.g., an optimal set of codewords) which minimizes the average energy. In such an embodiment, $\theta = G$ and $\Theta = \Theta_{avg}$. For a given input $G \in R^{n \times n}$, a spherical code having lower average energy may be determined using an iterative technique which converges to a fixed point in a few iterations.

With the codewords $\{Gz_i + u\}$ determined, a scaling factor may be determined as $$\beta = (MT2^{RT})^{1/2}\left(\sum_{i=1}^{2^{RT}} \|Gz_i + u\|^2\right)^{-1/2}.$$

If $\beta \geq 1$, then $G \in \Theta_{avg}$ and $$\prod_\Theta (G) = G;$$

else (e.g., if $\beta<1$), $$\prod\nolimits_\Theta (G) = \beta G.$$

A special case where an unconstrained lower complexity version can be obtained by restricting G to be a scaled real-orthogonal (e.g., real unitary) matrix. In this case, if ($\{\tilde{z}_i\}$, $\tilde{u}$) are the optimal (e.g., energy minimizing) set for generator I, then ($\{\tilde{z}_i\}$, $U\tilde{u}$) are optimal for any real-orthogonal U. Thus, the optimal scaling is $$\beta = (MT2^{RT})^{1/2}\left(\sum_{i=1}^{2^{RT}} \|\tilde{z}_i + \tilde{u}\|^2\right)^{-1/2}$$

and the optimization is conducted over the set $\{G=\beta U: U^T U=I\}$. Since the orthogonal group is a differentiable manifold, U can be expressed as a differentiable function of $n(n-1)/2$ parameters. One benefit is that an unconstrained stochastic gradient-descent may be implemented and the iterative method to determine a "good" spherical code needs to be implemented only once.

To satisfy the peak energy constraint as discussed above, all codewords must satisfy $\|Gz_i+u\|^2 \leq MT, \forall i$. Where $S_n(\sqrt{MT})$ is an n-dimensional sphere centered at the origin and of radius ($\sqrt{MT}$), if $Vol(V_0(G)) \leq 2^{-RT} Vol(S_n(\sqrt{MT}))$, there exists a translation vector u and coordinate vectors $\{z_i\}$ such that $\|Gz_i+u\|^2 \leq MT, 1 \leq i \leq 2^{RT}$. Since the error probability and its bounds for a given generator $\alpha G$ monotonically decrease in $\alpha$, the set of lattice generators $\Theta_{peak}=\{G:|G^TG|^{1/2}=2^{-RT}Vol(S_n(\sqrt{MT}))\}$ are considered.

An advantageous feature of the set $\Theta_{peak}$ is that any $G \in \Theta_{peak}$ can be expressed as a differentiable function of a parameter vector $\phi$. In this case, G=UR is the QR decomposition of $G \in \Theta_{peak}$, where U is unitary and R is lower triangular with positive diagonal elements. As mentioned previously, U is a differentiable function of $n(n-1)/2$ parameters.

Setting $\{R_{k,k}=\exp(t_k)\}_{k=1}^{n-1}$ and $$R_{n,n} = Vol(S_n(\sqrt{MT}))\left(2^{RT}\prod_{k=1}^{n-1} \exp(t_k)\right)^{-1},$$

R is a differentiable function of $n(n+1)/2-1$ parameters (e.g., $\{t_k\}$ and all its strictly lower triangular elements). Collecting all the $n(n-1)/2-1+n(n-1)/2=n^2-1$ parameters into a vector $\phi$, $G=G(\phi)$ is a differentiable function of $\phi$. Using a large number of translation vectors, a spherical code for the optimized generator matrix is determined to satisfy the peak energy constraint.

A continuous approximation may be used to obtain a parameterization for the set $\Theta_{avg}$ which is accurate for high rates. At high rates the random vector uniformly distributed over the set of codewords of a spherical lattice code can be considered a spherically uniform random vector. In particular, the high rate regime and any $G \in \Theta_{avg}$ are considered. $\{z_i\}$, u denotes its optimal (e.g., energy minimizing) coordinate vectors and translation vector, respectively. The codewords must lie within or on a sphere centered at $-u$ and denoted by $S_n(-u, r)$ for some radius r.

At high rates using the continuous approximation, $$R = \frac{\log(Vol(S_n(-u, r))/Vol(V_0(G)))}{T} + o(1)$$

and the probability mass function over the set of codewords may be approximated by the probability density function of a spherically uniform random vector. This results in the Riemann integral approximation $$2^{-RT}\sum_{i=1}^{2^{RT}} \|Gz_i + u\|^2 = \left([Vol(S_n(-u, r))]^{-1}\int_{S_n(-u,r)} \|x\|^2 dx\right) + o(1)$$

where $o(1)$ vanishes as $R \to \infty$.

The right hand sum (RHS) of the above equals $nr^2/(n+2)$ so the average power constraint implies that $r^2 \leq ((n+2)MT)/n=MT+1$. Thus, invoking the continuous approximation, any $G \in \Theta_{avg}$ should satisfy $2^{RT}Vol(V_0(G)) \leq Vol(S_n(\sqrt{MT+1}))$ which leads to $|G^TG|^{1/2} \leq 2^{-RT}Vol(S_n(\sqrt{MT+1}))$. At sufficiently high rates, considering that the error probability and its bounds for a given generator $\alpha G$ monotonically decrease in $\alpha$, the constraint set is defined as: $\Theta_{avg\text{-}cont}=\{G:|G^TG|^{1/2} \leq 2^{-RT}Vol(S_n(\sqrt{MT+1}))\}$.

Note that $\Theta_{peak} \subseteq \Theta_{avg\text{-}cont}$ and the continuous approximation results in an unconstrained gradient descent algorithm. As such, a spherical code may be determined only for the final (e.g., optimized) generator G and scaled to satisfy the average energy constraint.

The method ends at step 214.

With respect to steps 206-210 above, an improved upper bound and its derivative can be obtained as:

$$P_e^{ub-imp}(G) = Pr(O) + E_H[1(H^c \in O^c)P_e^{ub}(G, H)],$$

$$\frac{\partial P_e^{ub-imp}(G)}{\partial \phi} = E_H\left\{1(H^c \in O^c)\frac{\partial P_e^{ub}(G, H)}{\partial \phi}\right\},$$

where O is the outage set. The above equations may be obtained by taking the upper bound to be one when $H^3 \in O$. The improved upper bound is tighter for the naive decoder since the conditional upper bound often exceeds one when $H^c \in O$. Further, since the set O is independent of G, the derivatives of the equations above are readily obtained.

Figure 3:
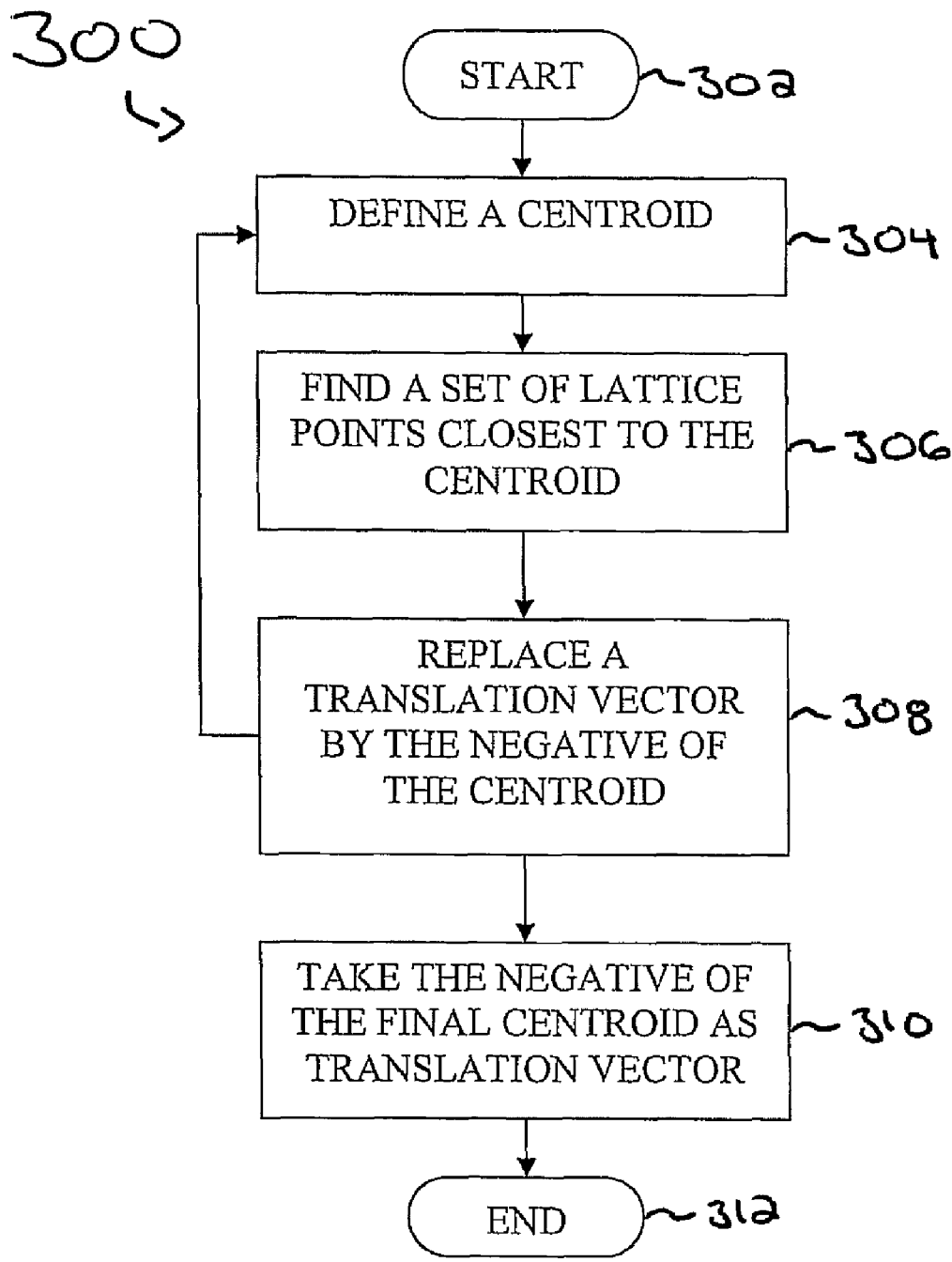
FIG. 3 is a flowchart showing the steps of a method of selecting a translation vector and coordinate vectors to reduce the average transmit energy.

FIG. 3 depicts a method 300 of selecting a translation vector to reduce the average transmit energy. The spherical lattice code may be designed at and/or by any of the controller 112, the transmitter 102, the receiver 108, the encoder 114, the decoder 116, or with any other appropriate means. In an advantageous embodiment, the spherical lattice code may be designed offline for use by the transmitter 102. The method 300 may select a translation vector u and coordinate vectors $\{Z_i\}$. The method 300 begins at step 302.

In step 304, a centroid is defined. The centroid is defined for the pair $\{G, \{z_i\}\}$ as $$\hat{x} = \frac{1}{|C|}\sum_{i=1}^{|C|} Gz_i.$$

In step 306, a set of lattice points closest to the centroid is found. The initial translation vector u may be any initial (e.g., random) vector lying in the Voronoi region of the lattice. The initial set of lattice points may be a set of $2^{RT}=|C|$ lattice points closest to $-u$. This step may use any one of the known methods to enumerate the coordinates of all the points belonging to a n-dimensional lattice generated by G (e.g., defined by the basis $\{g_1, \ldots, g_n\}$) that fall inside a sphere S of radius r centered at $-u$.

In step 308, the translation vector is replaced by the negative of the centroid.

After step 308, the method 300 may return control to step 304. That is, the method steps 304-308 may be repeated. Repeating step 308 results in a convergence after a few iterations.

In step 310, after the method 300 has converged, the negative of the final centroid is taken as the translation vector and the set $\{z_i\}$ as the coordinate vectors. The coordinate vectors, the translation vector and the generator matrix, together specify the spherical lattice code.

The method ends at step 312.

Figure 4:
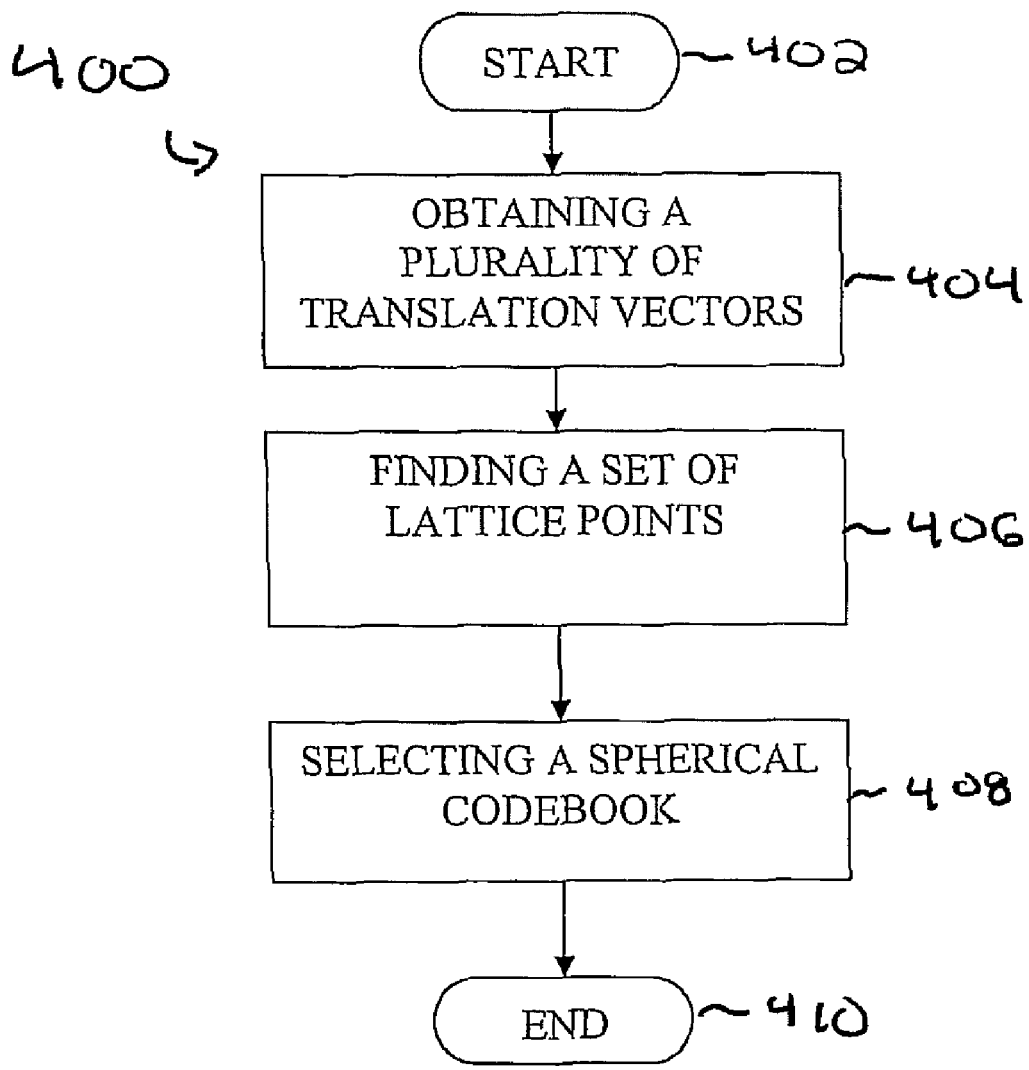
FIG. 4 is a flowchart showing the steps of a method of determining a spherical codebook satisfying the peak energy constraint.

FIG. 4 illustrates a method 400 of determining a spherical codebook satisfying the peak energy constraint. The spherical lattice code may be determined at and/or by any of the controller 112, the transmitter 102, the receiver 108, the encoder 114, the decoder 116, or with any other appropriate means. The method 400 may be applied when a given generator matrix lies in the set $\Theta_{peak}$. The method begins at step 402.

In step 404, a plurality of translation vectors are obtained. There may be L (where L is a large number) random translation vectors $u_l$, $l=1, \ldots, L$, uniformly distributed over a Voronoi region of the lattice generated by the generator matrix. To obtain translation vectors $u_l$, a random vector $q_l \in R^n$ is generated with the elements of $q_l$ distributed as i.i.d. U[0,1]. A coordinate vector $z_l$ may be found such that $Gz_l$ is closest to $Gq_l$ (e.g., $Gz_l=Q(Gq_l)$). Then, the translation vector $u_l=G(q_l-z_l)$, $l=1, \ldots, L$ is uniformly distributed over the Voronoi region of the lattice generated by G.

In step 406, a set of lattice points is found for each one of the translation vectors obtained in step 404. The set of lattice points may be $|C|$ lattice points closest to $-u$ and can be found as described above.

In step 408, a spherical code satisfying the peak energy constraint is selected. Over all $u_l$, one vector is chosen such that its corresponding spherical code satisfies the peak energy constraint. The method ends at step 410.

The foregoing description discloses only particular embodiments of the invention; modifications of the above disclosed methods and apparatus which fall within the scope of the invention will be readily apparent to those of ordinary skill in the art. For instance, it will be understood that the invention may utilize other decoders, such as ML decoders, MMSE decoders, etc. Accordingly, while the present invention has been disclosed in connection with specific embodiments thereof, it should be understood that other embodiments may fall within the spirit and scope of the invention, as defined by the following claims.

What is claimed is:

1. A method of generating a spherical lattice codebook comprising:
   determining a set of lattice points closest to a translation vector;
   replacing the translation vector with a negative of a centroid of the codebook;
   repeating replacing the translation vector with a negative of the centroid until the translation vector converges on a final centroid; and,
   determining the final centroid as the translation vector for the spherical codebook;
   determining characteristics of a channel;
   determining an error probability of a decoder;
   determining a gradient of the error probability; and,
   producing a spherical lattice codebook for the received signal by optimizing the gradient of the error probability.

2. The method of claim 1 wherein the decoder is a lattice decoder.

3. The method of claim 1 wherein the decoder is a lattice reduction aided decoder.

4. The method of claim 1 wherein the spherical codebook satisfies an average power constraint.

5. The method of claim 4 wherein the average power constraint is:

$$\frac{1}{|C|} \sum_{x \in C} \|x\|^2 \le TM,$$

wherein:
   C is the spherical lattice codebook;
   x is a codeword belonging to the spherical lattice codebook;
   T is a time; and,
   M is a number of transmit signals.

6. The method of claim 1 wherein the spherical codebook satisfies a peak power constraint.

7. The method of claim 6 wherein the peak power constraint is $\|x\|^2 \le TM$, $\forall x \in C$, wherein:
   C is the spherical lattice codebook;
   x is a codeword belonging to the spherical lattice codebook;
   T is a time; and,
   M is a number of transmit signals.

8. The method of claim 1 further comprising:
   determining a bound of the error probability;
   determining a gradient of the bound; and,
   producing a spherical lattice codebook for the received signal by optimizing the gradient of the error probability.

9. The method of claim 8 wherein the bound is an upper bound.

10. The method of claim 8 wherein the bound is a lower bound.

11. A method of generating a spherical lattice codebook for use in a multiple-input multiple-output data transmission system comprising:
    determining a set of lattice points closest to a translation vector;
    replacing the translation vector with a negative of a centroid of the codebook;
    repeating replacing the translation vector with a negative of the centroid until the translation vector converges on a final centroid; and,
    determining the final centroid as the translation vector for the spherical codebook;
    determining an error probability of a decoder;
    determining a function of the error probability;
    optimizing the function of the error probability; and,
    generating a spherical codebook from the optimized function.

12. The method of claim 11 further comprising:
    determining an upper bound of the error probability wherein the function is a gradient of the upper bound of the error probability.

13. The method of claim 11 further comprising:
    determining a lower bound of the error probability wherein the function is a gradient of the lower bound of the error probability.

14. The method of claim 11 wherein the function is a gradient of the error probability.

15. The method of claim 14 wherein optimizing the function of the error probability comprises:
performing stochastic optimization.

16. The method of claim 11 wherein generating a spherical codebook from the optimized function comprises generating a spherical codebook from the optimized function which satisfies a predetermined constraint.

17. The method of claim 16 wherein the constraint is an average power constraint given by:

$$\frac{1}{|C|}\sum_{x \in C} \|x\|^2 \leq TM,$$

wherein:
C is the spherical lattice codebook;
x is a codeword belonging to the spherical lattice codebook;
T is a time; and,
M is a number of transmit signals.

18. The method of claim 16 wherein the constraint is a peak power constraint given by: $\|x\|^2 \leq TM$, $\forall x \in C$, wherein:
C is the spherical lattice codebook;
x is a codeword belonging to the spherical lattice codebook;
T is a time; and,
M is a number of transmit signals.

19. A method of determining a spherical codebook satisfying a peak energy constraint comprising:
determining a plurality of translation vectors;
determining a set of lattice points from the plurality of translation vectors; and,
generating a spherical code corresponding to the set of lattice points and satisfying the peak energy constraint;
determining a set of lattice points closest to a translation vector;
replacing the translation vector with a negative of a centroid of the codebook;
repeating replacing the translation vector with a negative of the centroid until the translation vector converges on a final centroid; and,
determining the final centroid as the translation vector for the spherical codebook.

20. The method of claim 19 wherein obtaining a plurality of translation vectors comprises:
generating a random vector with i.i.d. distributed elements; and,
determining a coordinate vector for the random vector wherein a generated matrix of the coordinate vector is closest to a generated matrix of the random vector.

21. A method of selecting a spherical codebook to reduce an average transmit energy constraint comprising:
determining a set of lattice points closest to a translation vector;
replacing the translation vector with a negative of a centroid of a codebook;
repeating replacing the translation vector with a negative of the centroid until the translation vector converges on a final centroid; and,
determining the final centroid as the translation vector for the spherical codebook.

22. The method of claim 21 further comprising:
determining the centroid for a generator matrix.

23. The method of claim 21 wherein a first translation vector is a random vector in its Voronoi region.

24. An apparatus for generating a spherical lattice codebook for use in a multiple-input multiple-output data transmission system comprising:
means for determining an error probability of a decoder;
means for determining a function of the error probability;
means for optimizing the function of the error probability; and,
means for generating a spherical codebook from the optimized function;
means for determining a set of lattice points closest to a translation vector;
means for replacing the translation vector with a negative of a centroid of the codebook;
repeating replacing the translation vector with a negative of the centroid until the translation vector converges on a final centroid; and,
means for determining the final centroid as the translation vector for the spherical codebook.

25. The apparatus of claim 24 further comprising means for determining a gradient of the error probability, wherein the gradient is the function.

26. The apparatus of claim 24 further comprising:
means for determining an upper bound of the error probability wherein the function is a gradient of the upper bound of the error probability.

27. The apparatus of claim 24 further comprising:
means for determining a lower bound of the error probability wherein the function is a gradient of the lower bound of the error probability.

28. The apparatus of claim 24 further comprising:
means for performing stochastic optimization to optimize the function of the error probability.

29. The apparatus of claim 24 further comprising:
means for generating a spherical codebook from the optimized function comprising means for generating a spherical codebook from the optimized function which satisfies a predetermined constraint.

30. The apparatus of claim 29 further comprising:
means for determining an average power constraint given by $$\frac{1}{|C|}\sum_{x \in C} \|x\|^2 \leq TM,$$

wherein the average power constraint is the predetermined constraint and:
C is the spherical lattice codebook;
x is a codeword belonging to the spherical lattice codebook;
T is a time; and,
M is a number of transmit signals.

31. The apparatus of claim 29 further comprising:
means for determining a peak power constraint given by $\|x\|^2 \leq TM$, $\forall x \in C$, wherein the peak power constraint is the predetermined constraint and:
C is the spherical lattice codebook;
x is a codeword belonging to the spherical lattice codebook;
T is a time; and,
M is a number of transmit signals.

* * * * *